(12) United States Patent
Fust et al.

(10) Patent No.: US 12,103,387 B2
(45) Date of Patent: Oct. 1, 2024

(54) DISPLAY DEVICE, IN PARTICULAR FOR A VEHICLE

(71) Applicant: BEHR-HELLA THERMOCONTROL GmbH, Stuttgart (DE)

(72) Inventors: Winfried Fust, Lippstadt (DE); Tuomas Siekkinen, Lippstadt (DE); Tobias Schwab, Lippstadt (DE); Rüdiger Schmidt, Lippstadt (DE); Alberto Sanchez Castillo, Lippstadt (DE)

(73) Assignee: BHTC GmbH, Stuttgart (DE)

( * ) Notice: Subject to any disclaimer, the term of this patent is extended or adjusted under 35 U.S.C. 154(b) by 343 days.

(21) Appl. No.: 17/046,894

(22) PCT Filed: Apr. 11, 2019

(86) PCT No.: PCT/EP2019/059234
§ 371 (c)(1),
(2) Date: Oct. 12, 2020

(87) PCT Pub. No.: WO2019/197525
PCT Pub. Date: Oct. 17, 2019

(65) Prior Publication Data
US 2021/0178898 A1 Jun. 17, 2021

(30) Foreign Application Priority Data

Apr. 13, 2018 (DE) ...................... 10 2018 108 853.1

(51) Int. Cl.
*B60K 35/00* (2024.01)
*B60K 35/10* (2024.01)
*B60K 35/22* (2024.01)

(52) U.S. Cl.
CPC .............. *B60K 35/00* (2013.01); *B60K 35/10* (2024.01); *B60K 35/22* (2024.01);
(Continued)

(58) Field of Classification Search
None
See application file for complete search history.

(56) References Cited

U.S. PATENT DOCUMENTS 7,473,022 B2 1/2009 Yoo
8,528,878 B2 * 9/2013 Knittel .................... G05G 5/02
310/68 B
(Continued)

FOREIGN PATENT DOCUMENTS

CN 10144541 A 5/2009

OTHER PUBLICATIONS

Hodges et al., "ThinSight: versatile multi-touch sensing for thin form-factor displays", Association for Computing Machinery, Inc., p. 259-268, (Oct. 2007).
(Continued)

*Primary Examiner* — Reza Aghevli
(74) *Attorney, Agent, or Firm* — Christensen, Fonder, Dardi PLLC; Andrew H. Auderieth; Peter S. Dardi (57) ABSTRACT

The invention relates to a display device (210) which is provided with a display (212) and a backlighting unit (218) arranged behind the display (212). The backlighting unit (218) comprises a light guide plate (222) which has an upper light guide plate element (222a) and a lower light guide plate element (222b). Backlight (230) of light sources (220) is fed laterally into the upper light guide plate element (222a), which is emitted from the light emission side (228) of the light guide plate (222) after deflection and scattering within the light guide plate element (222a). Sensor radiation is fed into the lower light guide plate element (222b) by means of proximity sensor system transmitter elements (236), wherein said sensor radiation is likewise emitted from the light emission side (228) of the light guide plate (222) after reflection and scattering. Both light guide plate elements (222a, 222b) are optimized for the wavelengths of the
(Continued)

radiation which is fed into the latter. The lateral arrangement of the proximity sensor system transmitter elements (236) and the light sources (220) results in a space-saving arrangement. After reflection on an object located in front of the display (212), the sensor radiation reaches the proximity sensor system receiver elements (238).

20 Claims, 4 Drawing Sheets

(52) U.S. Cl.
CPC .............. *B60K 2360/1438* (2024.01); *B60K 2360/1523* (2024.01); *B60K 2360/336* (2024.01); *B60K 2360/48* (2024.01)

(56) References Cited

U.S. PATENT DOCUMENTS

| | | | | |
|---|---|---|---|---|
| 8,860,694 | B2 * | 10/2014 | Hwang | G06F 3/0421 |
| | | | | 345/173 |
| 9,557,846 | B2 | 1/2017 | Baharav et al. | |
| 9,592,735 | B2 * | 3/2017 | Marquas | G05G 1/02 |
| 9,869,344 | B2 * | 1/2018 | Lamminger | B29C 45/261 |
| 10,343,521 | B2 * | 7/2019 | Beschnitt | B60K 35/10 |
| 10,418,992 | B2 * | 9/2019 | Beschnitt | H01H 23/12 |
| 10,464,422 | B2 * | 11/2019 | Vogt | F16H 59/02 |
| 10,514,764 | B2 * | 12/2019 | Vogt | B60K 35/10 |
| 10,864,821 | B2 * | 12/2020 | Pankratz | G06F 3/03547 |
| 11,001,147 | B2 * | 5/2021 | Kirsch | G06F 3/016 |
| 11,016,571 | B2 * | 5/2021 | Trapp | B60L 53/14 |
| 11,225,146 | B2 * | 1/2022 | Lamminger | H03K 17/9645 |
| 2012/0229422 | A1 * | 9/2012 | Hwang | G06F 3/0421 |
| | | | | 345/175 |
| 2015/0084928 | A1 * | 3/2015 | Wyrwas | G06F 3/0421 |
| | | | | 345/175 |
| 2018/0068609 | A1 | 3/2018 | Yamazaki et al. | |
| 2018/0253157 | A1 * | 9/2018 | Pankratz | G06F 3/016 |
| 2019/0302891 | A1 * | 10/2019 | Beschnitt | G05G 5/03 |
| 2020/0174178 | A1 * | 6/2020 | Qin | G02B 6/0065 |

OTHER PUBLICATIONS

Liao et al., "Solution-processed finger-type organic proximity sensor with high displacement resolution", 2016 IEEE International Instrumentation and Measurement Technology Conference Proceedings, Taipei, pp. 1-6, (Jul. 2016).
International Search Report for Application No. PCT/EP2019/059234 dated Oct. 1, 2019.

* cited by examiner

DISPLAY DEVICE, IN PARTICULAR FOR A VEHICLE

This application is a National Stage filing of PCT Application No. PCT/EP2019/059234 filed Apr. 11, 2019, entitled "DISPLAY DEVICE, IN PARTICULAR FOR A VEHICLE", which claims priority to German Patent Application No. 10 2018 108 853.1 filed Apr. 13, 2018, both of which are incorporated herein by reference.

The invention relates to display device which is in particular employed in a vehicle.

Displays or similar display devices offering the additional functionality of inputting an operating command are becoming more and more popular for use in the interior of vehicles. To an increasing extent, such display/operating systems are additionally provided with the functionality of recognizing an approaching object in order to activate the display device for inputting an operating command or changing various operating interfaces depending on an approaching object, for example the hand or a finger of a person. For this purpose, such a proximity sensor system operates with optical radiation in the invisible wavelength range and in particular with IR light. The display device itself is provided with a backlighting unit for backlighting the display with visible light.

For reducing the overall depth of such display devices it is known to feed the backlight into a light guide plate from the side, said light guide plate being located behind the display. The transmitter and receiver elements for the optical proximity sensor system are in most cases located in an edge area next to the display or the so-called active area of the display. However, this area is not always available so that the freedom of design when devising a display device is limited.

In prior art, electric display devices which are equipped with a display with LED backlight and a proximity sensor system are known from US-A-2018/0069609, for example. US-A-2015/0084928 describes a backlighting unit based on the edge light concept. US-A-2015/0084928 illustrates an electric display device equipped with a display and a proximity sensor system.

It is an object of the invention to provide a display device, in particular for a vehicle, which is provided with a proximity sensor system that is arranged in a place-saving manner.

For achieving this object, a first embodiment of the invention suggests a display device, in particular for a vehicle, comprising a display,
a backlighting unit for backlighting the display,
wherein the backlighting unit comprises a plurality of light sources for backlight and a light guide plate having a light emission side facing the display, an opposite rear side and a circumferential side edge surface arranged between the light emission side and the rear side,
wherein the light sources are arranged next to the light guide plate in a laterally offset manner for feeding light through at least a partial area of the side edge surface of the light guide plate into the latter, and backlight fed into the light guide plate from the side is emitted from the light emission side of the light guide plate, and
a proximity sensor system for sensing an object, such as a hand of a person, for example, located in the area in front of the display,
wherein the proximity sensor system comprises at least one proximity sensor system transmitter element for transmitting invisible sensor radiation, in particular IR sensor radiation, and at least one proximity sensor system receiver element for receiving sensor radiation reflected from an object in the area in front of the display,
wherein the at least one proximity sensor system transmitter element is arranged laterally offset from an area of the side edge surface of the light guide plate and the sensor radiation in this area is fed into the side edge surface of the light guide plate and is emitted from the light emission side of the light guide plate, and
wherein the at least one proximity sensor system receiver element is arranged inside the display and/or between the display and the light guide plate and/or behind the light guide plate.

The display device according to the invention is provided with a display and a backlighting unit, arranged behind the display, for backlighting the display. This backlighting unit operates according to the so-called edge light concept where backlight is fed into a light guide plate from the side. The light guide plate is located behind the display and comprises a light emission side, a rear side opposite the light emission side and a circumferential side edge surface. The light sources of the backlighting unit are arranged opposite the side edge surface such that its backlight is fed into the light guide plate via the side edge surface where corresponding measures cause the backlight to be internally reflected to the light emission side and thus to be emitted from the light emission side and then through the display.

According to the invention, in the first variant, the sensor radiation of the at least one proximity sensor system transmitter element is also fed into a partial area of the side edge surface of the light guide plate. In the light guide plate, this sensor radiation, like the backlight, is deflected towards the light emission side and then penetrates the display and thus travels into the space or the area upstream of the display for being received by one or a plurality of proximity sensor system receiver elements after having been reflected from an object (hand, finger) located in this area. The received signals are processed in an evaluation unit which generally also controls the proximity sensor system transmitter elements and the at least one proximity sensor system transmitter element, respectively. For example, in the case of a plurality of proximity sensor system transmitter elements, they can be sequentially or cyclically controlled such that receive signals can be received by the proximity sensor system receiver elements distributedly arranged across the display for detecting in which area in front of the display an object is located. Thus, the object recognition can be realized at a specific resolution determined by the density of transmitter and receiver elements of the proximity sensor system.

Generally, it is advantageous when a reflector reflecting the backlight and the sensor radiation is arranged on the rear side of the light guide plate, or when the rear side of the light guide plate comprises a reflective coating reflecting the back light or the sensor radiation.

Typically, a particularly intensive illumination of the display with backlight is desired. This means that along the side edge surface of the light guide plate backlight sources are already tightly packed. If, therefore, there is no space left for the proximity sensor system transmitter elements between these backlight sources, it is appropriate to arrange these proximity sensor system transmitter elements above or below the backlight sources. This means that the light guide plate must be of a thicker configuration such that two rows of radiation sources, namely the backlight sources on the one hand and the proximity sensor system transmitter elements on the other hand can be arranged one above the other. However, the manufacture of the light guide plate by injection molding could be problematic due to the required larger thickness of the light guide plate as compared to the first approach of the first variant of the concept according to the invention presented above.

Thus, it is advantageous when the light guide plate comprises an upper light guide material layer having a circumferential upper side edge surface and a lower light guide material layer having a circumferential lower side edge surface, wherein the light sources feed backlight into at least a partial area of the upper side edge surface and the at least one proximity sensor system transmitter element feeds sensor radiation into at least a partial area of the lower side edge surface. In this approach, the light guide plate thus comprises two light guide material layers which are integrally formed with each other or separate from each other. In other words, two light guide plate elements are employed. Each light guide plate element serves for deflecting a different radiation. Thus, the upper light guide plate element deflects the backlight for causing it to be emitted from the light emission side of the light guide plate facing the display. The lower light guide plate element receives the sensor radiation and deflects it towards the display. Thus, the sensor radiation also passes through the upper light guide material layer and is emitted therefrom. The advantage of using two light guide plate elements is that each light guide material layer for the radiation fed into the light guide material layer and deflected there can be optimized with regard to both the material as well as the radiation and the internal configuration required for the homogeneous lateral radiation emission.

The concept described above can also be inversely employed such that the light sources feed backlight into at least a partial area of the lower side edge surface and the at least one proximity sensor system transmitter element feeds sensor radiation into at least a partial area of the upper side edge surface.

In the two cases illustrated above, the two light guide material layers can be separately produced and arranged as plate elements adjacent to each other.

According to another appropriate embodiment of the invention, the display device can be provided with a reflector, reflecting the backlight and the sensor radiation, on the rear side of the lower light guide material layer facing away from the upper light guide material layer and/or a reflective coating, reflecting the backlight and the sensor radiation, on the rear side of the lower light guide material layer facing away from the upper light guide material layer.

In the aspect of the invention described before, a common reflector for both radiations (sensor radiation and backlight) is located on the rear side of the lower light guide material layer (i.e. the lower light guide plate element). However, a reflective layer can also additionally be arranged in the area between the two light guide plate elements, i.e. between the upper and the lower light guide material layer. However, this reflective coating is then selectively reflective, that is it reflects the radiation fed into the upper light guide plate element, while it is transmissive to radiation emitted from the lower light guide plate element. Thus, the reflector between the two plate elements is semi-transmissive. Such optical filters which are either reflective or transmissive depending on the wavelength are generally known.

The concept mentioned above can now be realized by the display device being provided with a reflector, reflecting the sensor radiation, on the rear side of the lower light guide material layer facing away from the upper light guide material layer or a reflective coating, reflecting the sensor radiation, on the rear side of the lower light guide material layer facing away from the upper light guide material layer, for example, wherein between the two light guide material layers a reflector reflecting the backlight and transmissive to the sensor radiation is arranged or on one of the two sides facing each other of the two light guide material layers a coating reflecting the backlight and transmissive to the sensor radiation is arranged.

Alternatively to what has been described before, the display device can also be provided with a reflector, reflecting the backlight, on the rear side of the lower light guide material layer facing away from the upper light guide material layer or a reflective coating, reflecting the backlight, on the rear side of the lower light guide material layer facing away from the upper light guide material layer, wherein between the two light guide material layers a reflector reflecting the sensor radiation and transmissive to the backlight is arranged or on one of the two sides facing each other of the two light guide material layers a coating reflecting the sensor radiation and transmissive to the backlight is arranged.

As far as a reflector is referred to above, this means an element provided in addition to the light guide plate and the light guide plate elements, respectively, and comprising a substrate with a corresponding coating, and a coating applied to the corresponding surface of the light guide plate and one of the light guide plate elements, respectively.

According to another variant, for achieving the aforementioned object, the invention further suggests a display device, in particular for a vehicle, comprising a display, a backlighting unit for backlighting the display, wherein the backlighting unit comprises a plurality of light sources for backlight and a light guide plate having a light emission side facing the display, an opposite rear side and a circumferential side edge surface arranged between the light emission side and the rear side, wherein the light sources are arranged next to the light guide plate in a laterally offset manner for feeding light through at least a partial area of the side edge surface of the light guide plate into the latter, and backlight fed into the light guide plate from the side is emitted from the light emission side of the light guide plate, and a proximity sensor system for sensing an object, such as a hand of a person, for example, located in the area in front of the display, wherein the proximity sensor system comprises at least one proximity sensor system transmitter element for transmitting invisible sensor radiation, in particular IR sensor radiation, and at least one proximity sensor system receiver element for receiving sensor radiation reflected from an object in the area in front of the display, wherein the at least one proximity sensor system transmitter element is arranged in a manner facing the rear side of the light guide plate and feeds sensor radiation into the light guide plate therethrough, and a reflector reflecting the backlight and transmissive to the sensor radiation on the rear side of the light guide plate or a coating reflecting the backlight and transmissive to the sensor radiation on the rear side of the light guide plate, wherein the at least one proximity sensor system receiver element is arranged inside the display and/or between the display and the light guide plate and/or behind the light guide plate.

In this variant of the invention, the proximity sensor system transmitter element(s) are arranged behind the light guide plate and thus face the rear side thereof via which they feed the sensor radiation into the light guide plate.

In this variant, too, it can appropriately be provided that the light guide plate comprises an upper light guide material layer having a circumferential upper side edge surface and a lower light guide material layer having a circumferential lower side edge surface, wherein the light sources feed backlight into at least a partial area of one, e.g. the upper, side edge surface and the at least one proximity sensor system transmitter element feeds sensor radiation into at least a partial area of the rear side of the lower light guide material layer facing away from the upper light guide material layer, and that between the two light guide material layers a reflector reflecting the backlight and transmissive to the sensor radiation is arranged or on one of the two sides facing each other of the two light guide material layers a coating reflecting the backlight and transmissive to the sensor radiation is arranged.

As explained above, the light guide plate has the characteristic of reflecting and scattering the fed radiation for allowing it to be emitted as homogeneously as possible from the light emission side. The measures required for reflecting and scattering are generally known and include provision of surface structures formed on at least one of the two main surfaces of the light guide plate and/or light-scattering particles or structures inside the light guide plate.

In addition, an optical diffuser can be arranged between the light emission side of the light guide plate and the display for further homogenizing the backlight and possibly the sensor radiation.

Hereunder the invention will be explained in detail on the basis of several exemplary embodiments with reference to the drawing in which.

Figure 1:
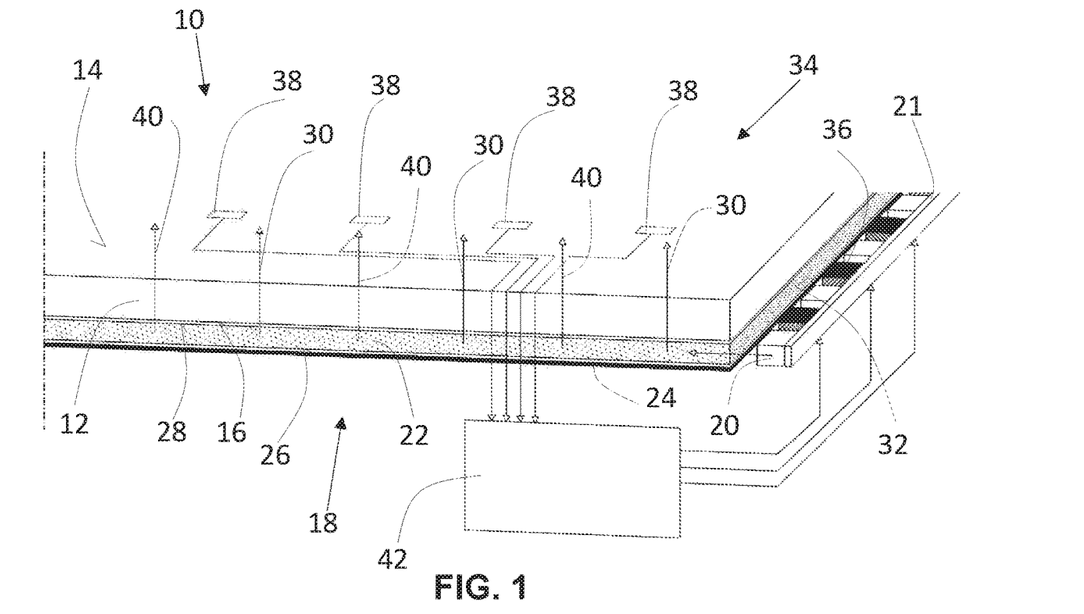
FIG. 1 schematically shows the features of the setup of a display device essential to the invention according to a first exemplary embodiment, FIG. 2 schematically shows the features of the setup of a display device essential to the invention according to a second exemplary embodiment, FIG. 3 schematically shows the features of the setup of a display device essential to the invention according to a third exemplary embodiment, FIG. 4 schematically shows the features of the setup of a display device essential to the invention according to a fourth exemplary embodiment, FIG. 5 schematically shows the features of the setup of a display device essential to the invention according to a fifth exemplary embodiment, FIG. 6 schematically shows the features of the setup of a display device essential to the invention according to a sixth exemplary embodiment, and FIG. 7 schematically shows the features of the setup of a display device essential to the invention according to a seventh exemplary embodiment.

FIG. 1 schematically shows a first exemplary embodiment of a display device 10 with regard to the features essential to the invention. The display device 10 comprises a display 12 which is configured according to the LCD technology, for example. Other designs for optically representing characters, diagrams and the like are also possible.

The display 12 has a display side 14 as well as rear side 16 facing away from the former. Below the display 12 a backlighting unit 18 is located which comprises light sources 20 designed, according to the edge light concept, in the form of LEDs, for example, and arranged on a carrier strip 21 (e.g. rigid or flexible circuit board), and a light guide plate 22 as well as a reflector 24 located below the light guide plate 22. Instead of the reflector 24, the rear side 26 of the light guide plate 22 facing away from the display 12 can also be provided with a reflective coating.

On the light emission side 28 of the light guide plate 22 facing the display 12 that backlight (indicated by arrows 30) is emitted which is fed from the light sources 30 into the side edge surface 32 of the light guide plate 22.

The display device 10 further comprises an optical proximity sensor system 34 which comprises one or a plurality of proximity sensor system transmitter elements 36 on the one hand as well as one or a plurality of proximity sensor system receiver elements 38. These proximity sensor system receiver elements are either integrated in the display 12 or arranged behind the display 12. The proximity sensor system transmitter elements 36 transmit sensor radiation in the invisible wavelength range (in the form of IR radiation, for example) which, like the backlight, is fed into the light guide plate 22 via the side edge surface 32 and, like the backlight 30, is emitted from there by reflection and deflection from the light guide emission side 28 for traveling as sensor light (see arrows 40) into the area or the space in front of the light emission side 28 of the display 12. An object located in the area or space, such as a hand or a finger of a hand of a person, is recognized by the sensor radiation 40 being reflected and received by one or a plurality of proximity sensor system receiver elements 38. The evaluation of the signals supplied by the proximity sensor system receiver elements 38 is performed in an evaluation unit 42 which also controls the proximity sensor system transmitter elements 36. By a corresponding sequential control of the proximity sensor system transmitter elements 36 and by knowing the location, i.e. the position of those proximity sensor system receiver elements 38 which receive or can receive the sequentially transmitted sensor radiation, an object above the display 12 or in front of the display 12 can be localized and approximately sensed with regard to its position, respectively. Hence, gesture recognition can be realized, for example.

In the first embodiment of the display device, thus the light sources 20 and the proximity sensor system transmitter elements 36 preferably configured as LEDs are located on the side of the light guide plate 22 and preferably along a plurality of side edges of the light guide plate 22. Thus, it is not required that proximity sensor system transmitter elements or light sources are arranged below the light guide plate 22 such that the overall depth of the display device 10 is reduced.

Figure 2:
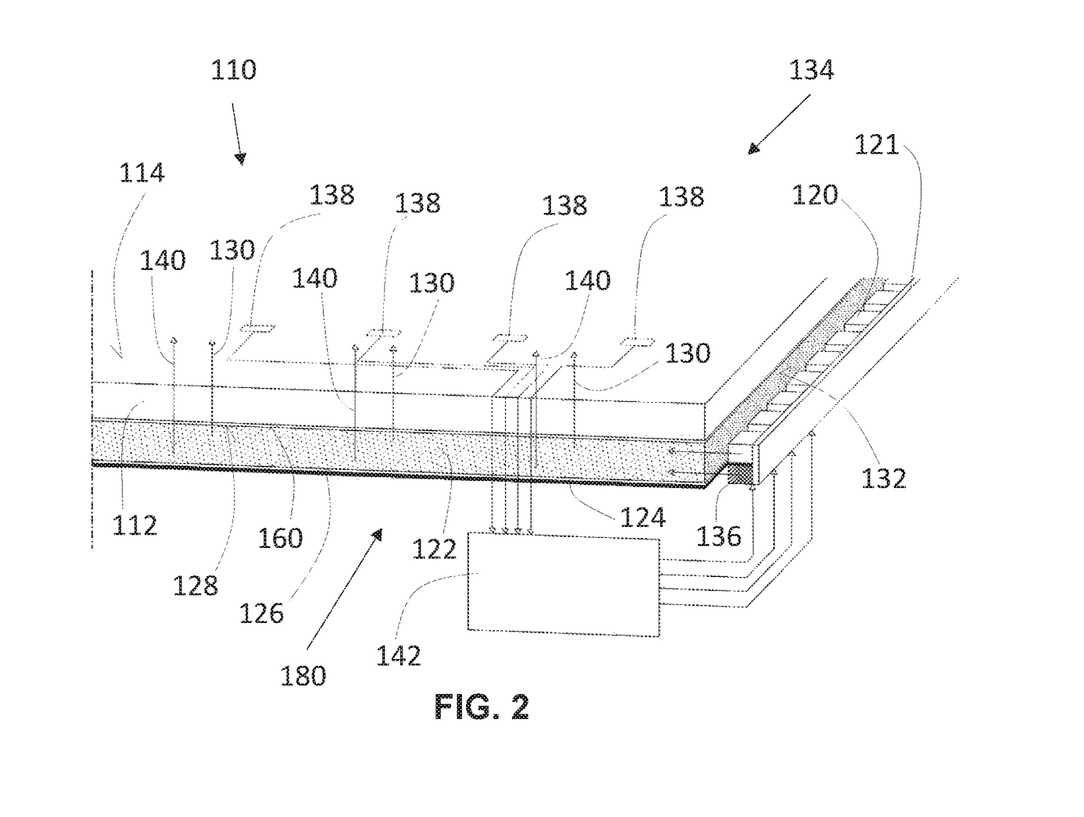

In FIG. 2 a second exemplary embodiment of a display device 110 is shown. When the elements shown correspond to those of the display device 10 of FIG. 1 in terms of design or function, they are designated by reference numerals raised by 10.

In contrast to the display device 10, in the display device 110 of FIG. 2 the light sources 120 and the proximity sensor system transmitter elements 136 are arranged in two rows arranged one above the other on a carrier strip 121. The light guide plate 122 is enlarged according to its height such that both radiation-transmitting elements, namely the light sources 120 and the proximity sensor system transmitter element 136 introduce radiation into the light guide plate 122 from the side via one of the side edge surfaces 132 or a plurality of side edge surfaces 132. Otherwise, the setup of the display device 110 is similar to that of the display device 10.

Figure 3:
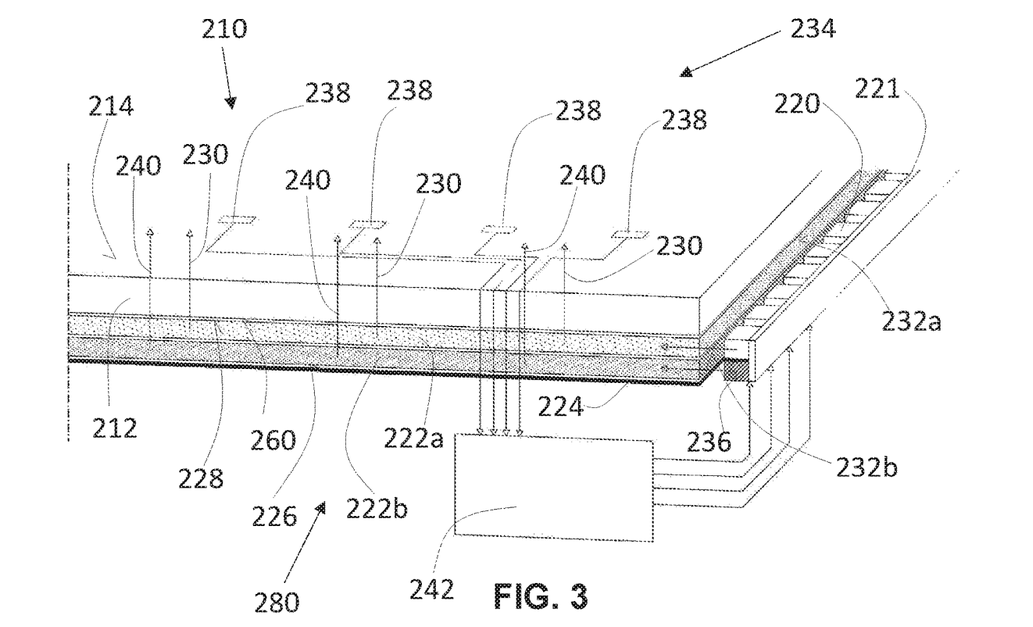

In FIG. 3 the general setup of a third embodiment of a display device 210 is schematically shown. In FIG. 2 those elements which have the same functions as or are identical with the display device elements of FIG. 2 are designated by reference numerals raised by 200.

As in the exemplary embodiment of the display device 110 of FIG. 2, in the display device 210 of FIG. 3, too, the elements transmitting radiation, namely the light sources 220 and the proximity sensor system transmitter elements 236 are arranged in two rows arranged one above the other on the carrier strip 221. In contrast to the display devices 10 and 110, the light guide plate 222 is configured as two light guide plate elements 222a and 222b arranged one above the other. Each one of these light guide plate elements 222a, 222b receives radiation either from the light sources 220 or the proximity sensor system transmitter elements 236. The radiation of the light sources 220, i.e. the backlight, travels into the side edge surface 232a of the upper (in FIG. 3) light guide plate element 222a, while the IR sensor radiation of the proximity sensor system transmitter elements 236 travels into the side edge surface 232b of the lower light guide plate element 222b. Below the bipartite light guide plate 222 a reflector 224 is located, or the lower side of the lower light guide plate element 222b is provided with a coating having reflection properties. The division of the light guide plate 222 into the two light guide plate elements 222a and 222b allows for ensuring that the optical properties can be adapted to the respective radiation (backlight and sensor radiation, respectively) and thus optimized by the selection of the light guide materials and their configuration.

Figure 4:
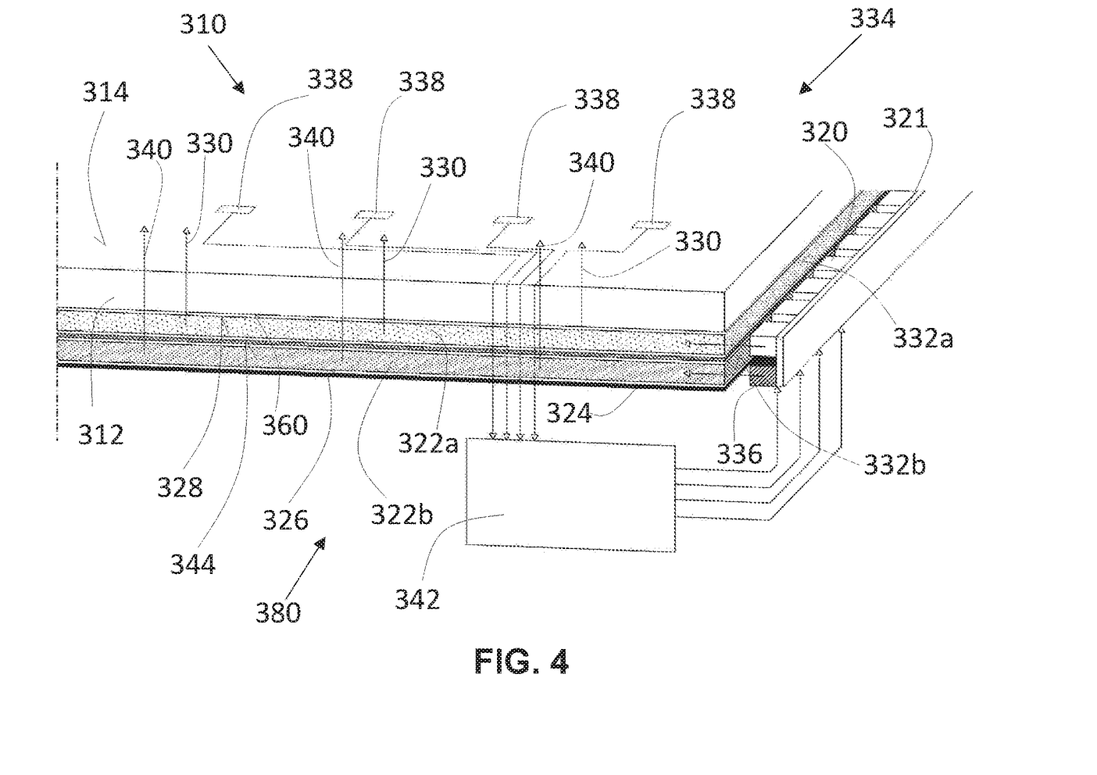

FIG. 4 shows an embodiment of a display device 310 where, again, those elements which are similar to or identical with the elements of the display device 210 are designated by reference numerals raised by 100.

The difference between the display device 310 and that of FIG. 3 is the additional arrangement of a semitransmissive reflector 344 and a semitransmissive coating, respectively, arranged between the two light guide plate elements 322a and 322b. This semitransparent reflector 344 and this semitransparent coating, respectively, which is either arranged on the lower side of the upper light guide plate element 322a or on the upper side of the lower light guide plate element 322b reflects only the backlight fed into the upper light guide plate element 322a, while it is transmissive to the sensor radiation emitted from the lower light guide plate element 322b.

Figure 5:
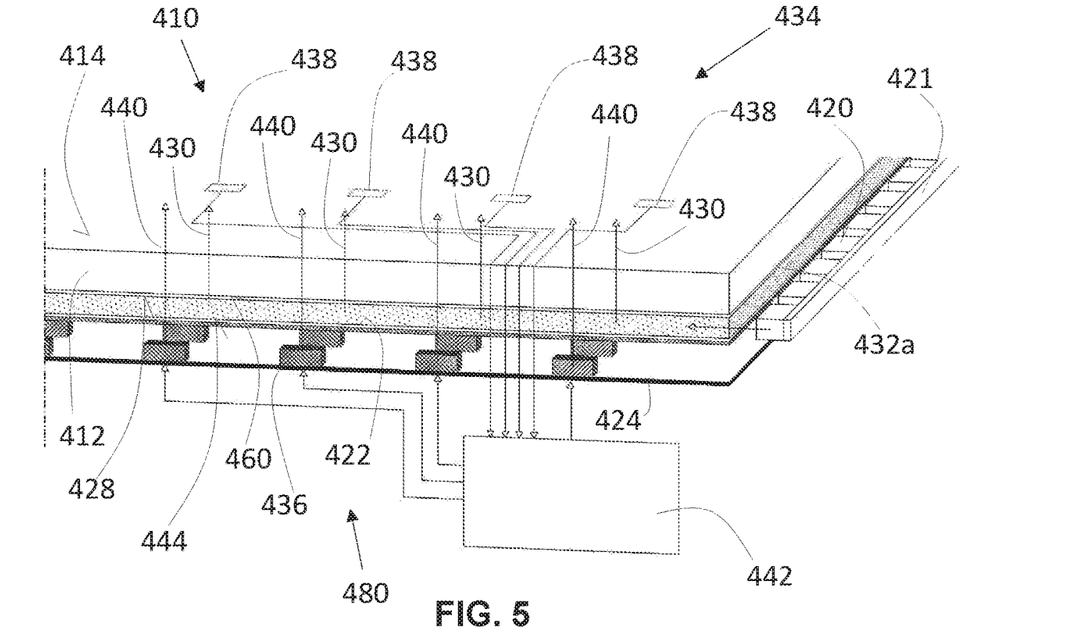
Figure 6:
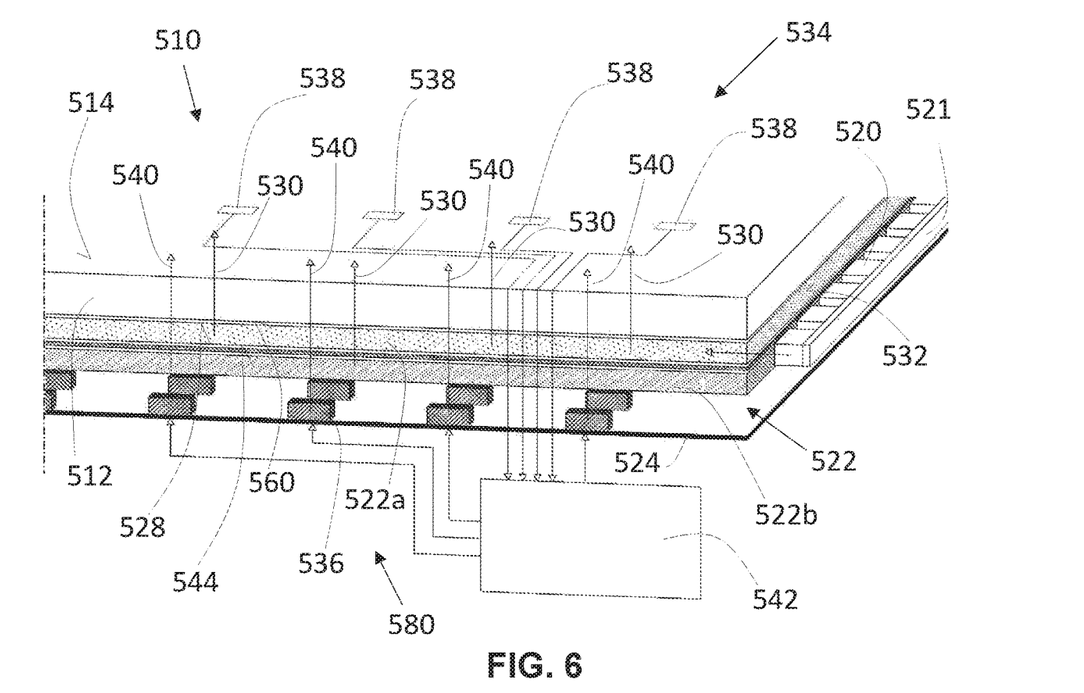

In FIGS. 5 and 6 two exemplary embodiments of display devices 410 and 510, respectively, are shown where, in contrast to the exemplary embodiments of FIGS. 1 to 4, the proximity sensor system transmitter elements are arranged below the light guide plate. Here, again, those components of the display device 410 which have the same functions and design as those of the display device 10 of FIG. 1 are designated by reference numerals raised by 400.

On the lower side of the light guide plate 422 a semitransmissive reflector 444 or a semitransmissive reflective coating, respectively, reflecting the backlight (see arrows 430) of the light sources 420 towards the light emission side of the light guide plate 422 on the one hand and being transmissive to the sensor radiation coming from below (see arrows 440) is arranged.

The display device 510 of FIG. 6, in contrast to the display device 410 of FIG. 5, additionally comprises another light guide plate element 522b below the semitransmissive reflector 544, which, together with the light guide plate element 522a used for distributing the backlight, forms the light guide plate 522.

It should be appreciated that the arrangement of the light sources and the proximity sensor system transmitter elements can be vice versa as compared to the situation shown in FIGS. 5 and 6. The backlight sources can hence be arranged below the light guide plate or the assembly of the two light guide plate elements, respectively, while the proximity sensor system transmitter elements are located on the side of the light guide plate and on the side of one of the light guide plate elements, respectively.

Figure 7:
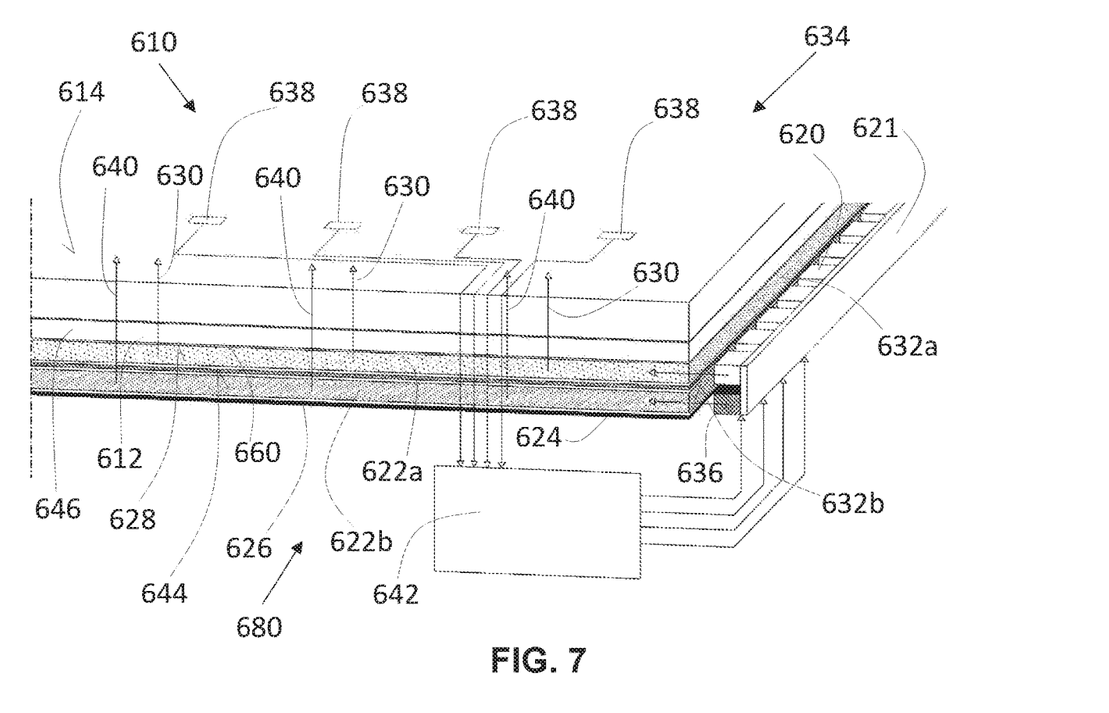

As described above, in all exemplary embodiments of the display devices 10, 110, 210, 310, 410 and 510 described here, the light guide plates and the light guide plate elements, respectively, ensure a homogenization of the radiation emitted by them. This is realized by means of measures, generally known in prior art, for scattering and/or reflecting due to internal reflections inside the light guide plates. For further homogenization of the emitted radiation, a diffuser can be arranged between the light guide plates and the display, as is exemplified in FIG. 7 on the basis of the display device 610 (see diffuser 646).

Further, in each display or in each exemplary embodiment of the display device a touch sensor system is appropriately integrated which is not shown in the Figures for the sake of clarity.

LIST OF REFERENCE NUMERALS

10 Display device
12 Display
14 Display side of the display
16 Rear side of the display
18 Backlighting unit
20 Light sources
21 Carrier strip
22 Light guide plate
24 Reflector
26 Rear side of the light guide plate
28 Light emission side of the light guide plate
30 Backlight
32 Side edge surface of the light guide plate
34 Proximity sensor system
36 Proximity sensor system transmitter elements
38 Proximity sensor system receiver elements
40 Sensor radiation
42 Evaluation unit
110 Display device
112 Display
114 Display side of the display
116 Rear side of the display
118 Backlighting unit
120 Light sources
121 Carrier strip
122 Light guide plate
124 Reflector
126 Rear side of the light guide plate
128 Light emission side of the light guide plate
130 Backlight
132 Side edge surface of the light guide plate
134 Proximity sensor system
136 Proximity sensor system transmitter elements
138 Proximity sensor system receiver elements
140 Sensor radiation
142 Evaluation unit
210 Display device
212 Display
214 Display side of the display
216 Rear side of the display 218 Backlighting unit
220 Light sources
221 Carrier strip
222a Upper light guide plate elements
222b Lower light guide plate elements
224 Reflector
226 Rear side of the light guide plate
228 Light emission side of the light guide plate
230 Backlight
232a Side edge surface of the upper light guide plate elements
232b Side edge surface of the lower light guide plate elements
234 Proximity sensor system
236 Proximity sensor system transmitter elements
238 Proximity sensor system receiver elements
240 Sensor radiation
242 Evaluation unit
310 Display device
312 Display
314 Display side of the display
316 Rear side of the display
318 Backlighting unit
320 Light sources
321 Carrier strip
322a Upper light guide plate elements
322b Lower light guide plate elements
324 Reflector
326 Rear side of the light guide plate
328 Light emission side of the light guide plate
330 Backlight
332a Side edge surface of the upper light guide plate elements
332b Side edge surface of the lower light guide plate elements
334 Proximity sensor system
336 Proximity sensor system transmitter elements
338 Proximity sensor system receiver elements
340 Sensor radiation
342 Evaluation unit
344 Reflector
410 Display device
412 Display
414 Display side of the display
416 Rear side of the display
418 Backlighting unit
420 Light sources
421 Carrier strip
422 Light guide plate
424 Reflector
426 Rear side of the light guide plate
428 Light emission side of the light guide plate
430 Backlight
432 Side edge surface of the light guide plate
434 Proximity sensor system
436 Proximity sensor system transmitter elements
438 Proximity sensor system receiver elements
440 Sensor radiation
442 Evaluation unit
444 Reflector
510 Display device
512 Display
514 Display side of the display
516 Rear side of the display
518 Backlighting unit
520 Light sources
521 Carrier strip
522a Upper light guide plate
522b Lower light guide plate
524 Reflector
526 Rear side of the light guide plate
528 Light emission side of the light guide plate
530 Backlight
532 Side edge surface of the light guide plate
534 Proximity sensor system
536 Proximity sensor system transmitter elements
538 Proximity sensor system receiver elements
540 Sensor radiation
542 Evaluation unit
544 Reflector
610 Display device
612 Display
614 Display side of the display
616 Rear side of the display
618 Backlighting unit
620 Light sources
621 Carrier strip
622a Upper light guide plate
622b Lower light guide plate
624 Reflector
626 Rear side of the light guide plate
628 Light emission side of the light guide plate
630 Backlight
632a Side edge surface of the upper light guide plate elements
632b Side edge surface of the lower light guide plate elements
634 Proximity sensor system
636 Proximity sensor system transmitter elements
638 Proximity sensor system receiver elements
640 Sensor radiation
642 Evaluation unit
644 Reflector
646 Diffuser

The invention claimed is:

1. A display device, in particular for a vehicle, comprising
a display,
a backlighting unit for backlighting the display
wherein the backlighting unit comprises a plurality of light sources for backlight and a light guide plate having a light emission side facing the display, an opposite rear side and a circumferential side edge surface arranged between the light emission side and the rear side,
wherein the light sources are arranged next to the light guide plate in a laterally offset manner for feeding light through at least a partial area of the side edge surface of the light guide plate into the latter, and wherein backlight fed into the light guide plate from the side is emitted from the light emission side of the light guide plate, and
a proximity sensor system for sensing an object located in the area in front of the display,
wherein the proximity sensor system comprises at least one proximity sensor system transmitter element for transmitting invisible sensor radiation, in particular IR sensor radiation, and at least one proximity sensor system receiver element for receiving sensor radiation reflected from an object in the area in front of the display,
wherein the at least one proximity sensor system transmitter element is arranged laterally offset from an area of the side edge surface of the light guide plate and wherein the sensor radiation in this area is fed into the side edge surface of the light guide plate and is emitted from the light emission side of the light guide plate, and wherein the at least one proximity sensor system receiver element is arranged inside the display, and/or directly between the display and the light guide plate, and/or behind the light guide plate configured to directly receive light transmitted through the light guide plate.

2. The display device according to claim 1, wherein the at least one proximity sensor system transmitter element is arranged between the light sources of the backlighting unit.

3. The display device according to claim 1, wherein on the rear side of the light guide plate a reflector reflecting the backlight and the sensor radiation is arranged, or that the rear side of the light guide plate comprises a reflective coating reflecting the backlight or the sensor radiation.

4. The display device according to claim 1, wherein the at least one proximity sensor system transmitter element is positioned below or above the plane in which the light sources are arranged.

5. The display device according to claim 4, wherein the light guide plate comprises an upper light guide material layer having a circumferential upper side edge surface and a lower light guide material layer having a circumferential lower side edge surface, wherein the light sources feed backlight into at least a partial area of the upper side edge surface and the at least one proximity sensor system transmitter element feeds sensor radiation into at least a partial area of the lower side edge surface, wherein each light guide plate element serves for deflecting different radiation.

6. The display device according to claim 5, wherein the two light guide material layers rest against adjoin each other.

7. The display device according to claim 5, comprising a reflector, reflecting the backlight and the sensor radiation, on the rear side of the lower light guide material layer facing away from the upper light guide material layer, and/or a reflective coating, reflecting the backlight and the sensor radiation, on the rear side of the lower light guide material layer facing away from the upper light guide material layer.

8. The display device according to claim 5 comprising a reflector, reflecting the sensor radiation, on the rear side of the lower light guide material layer facing away from the upper light guide material layer, or a reflective coating, reflecting the sensor radiation, on the rear side of the lower light guide material layer facing away from the upper light guide material layer, wherein between the two light guide material layers a reflector reflecting the backlight and being transmissive for the sensor radiation is arranged, or at one of the two sides facing each other of the two light guide material layers a reflective coating reflecting the backlight and transmissive to the sensor radiation is arranged.

9. The display device according to claim 4, wherein the light guide plate comprises an upper light guide material layer having a circumferential upper side edge surface and a lower light guide material layer having a circumferential lower side edge surface, wherein the light sources feed backlight into at least a partial area of the lower side edge surface and the at least one proximity sensor system transmitter element feeds sensor radiation into at least a partial area of the upper side edge surface.

10. The display device according to claim 9, comprising a reflector, reflecting the backlight, on the rear side of the lower light guide material layer facing away from the upper light guide material layer, or a reflective coating, reflecting the backlight, on the rear side of the lower light guide material layer facing away from the upper light guide material layer, wherein between the two light guide material layers a reflector reflecting the sensor radiation and being transmissive for the backlight is arranged, or at one of the two sides facing each other of the two light guide material layers a reflective coating reflecting the sensor radiation and transmissive to the backlight is arranged.

11. The display device according to claim 1, wherein the light guide plate is of an optically diffuse configuration at least for the backlight and also for the sensor radiation.

12. The display device according to claim 1, comprising an optical diffuser between the light emission side of the light guide plate and the display for further homogenizing the backlight and possibly the sensor radiation.

13. The display device according to claim 1, wherein the display is provided with a touch sensor system.

14. A display device, in particular for a vehicle, comprising
a display,
a backlighting unit for backlighting the display,
wherein the backlighting unit comprises a plurality of light sources for backlight and a light guide plate having a light emission side facing the display, an opposite rear side and a circumferential side edge surface arranged between the light emission side and the rear side,
wherein the light sources are arranged next to the light guide plate in a laterally offset manner for feeding light through at least a partial area of the side edge surface of the light guide plate into the latter, and wherein backlight fed into the light guide plate from the side is emitted from the light emission side of the light guide plate, and
a proximity sensor system for sensing an object located in the area in front of the display,
wherein the proximity sensor system comprises at least one proximity sensor system transmitter element for transmitting invisible sensor radiation, in particular IR sensor radiation, and at least one proximity sensor system receiver element for receiving sensor radiation reflected from an object in the area in front of the display,
wherein the at least one proximity sensor system transmitter element is arranged in a manner facing the rear side of the light guide plate and feeds sensor radiation into the light guide plate therethrough, and
a reflector reflecting the backlight and being transmissive for the sensor radiation on the rear side of the light guide plate, or a coating reflecting the backlight being transmissive for the sensor radiation on the rear side of the light guide plate,
wherein the at least one proximity sensor system receiver element is arranged inside the display, and/or directly between the display and the light guide plate, and/or behind the light guide plate configured to directly receive light transmitted through the light guide plate.

15. The display device according to claim 14, wherein the light guide plate comprises an upper light guide material layer having a circumferential upper side edge surface and a lower light guide material layer having a circumferential lower side edge surface, wherein the light sources feed backlight into at least a partial area of the one side edge surface, and the at least one proximity sensor system transmitter element feeds sensor radiation into at least a partial area of the rear side of the lower light guide material layer facing away from the upper light guide material layer, and that between the two light guide material layers a reflector reflecting the backlight and transmissive to the sensor radiation is arranged, or at one of the two sides of the two light guide material layers, which sides facing each other, a reflective coating reflecting the backlight and being transmissive for the sensor radiation is arranged.

16. The display device according to claim 15, comprising an optical diffuser between the light emission side of the light guide plate and the display for further homogenizing the backlight and possibly the sensor radiation.

17. The display device according to claim 15, wherein the display is provided with a touch sensor system.

18. The display device according to claim 14, wherein the light guide plate is of an optically diffuse configuration at least for the backlight and also for the sensor radiation.

19. The display device according to claim 14, comprising an optical diffuser between the light emission side of the light guide plate and the display for further homogenizing the backlight and possibly the sensor radiation.

20. The display device according to claim 14, wherein the display is provided with a touch sensor system.

\* \* \* \* \*